United States Patent
Yokota et al.

(10) Patent No.: US 8,101,867 B2
(45) Date of Patent: Jan. 24, 2012

(54) ELECTROLESS NI-P PLATING METHOD AND SUBSTRATE FOR ELECTRONIC COMPONENT

(75) Inventors: Masayuki Yokota, Izumi (JP); Ken Asada, Izumi (JP); Fumiaki Kikui, Izumi (JP)

(73) Assignee: Neomax Materials Co., Ltd., Suita-shi, Osaka (JP)

( * ) Notice: Subject to any disclaimer, the term of this patent is extended or adjusted under 35 U.S.C. 154(b) by 497 days.

(21) Appl. No.: 12/305,480

(22) PCT Filed: Jun. 22, 2007

(86) PCT No.: PCT/JP2007/062588
§ 371 (c)(1),
(2), (4) Date: Dec. 18, 2008

(87) PCT Pub. No.: WO2007/148785
PCT Pub. Date: Dec. 27, 2007

(65) Prior Publication Data
US 2009/0178831 A1    Jul. 16, 2009

(30) Foreign Application Priority Data

Jun. 23, 2006  (JP) .................. 2006-174215
Jul. 13, 2006  (JP) .................. 2006-193223

(51) Int. Cl.
*H05K 1/09* (2006.01)
(52) U.S. Cl. ........................................ 174/257
(58) Field of Classification Search ............ 174/257
See application file for complete search history.

(56) References Cited

U.S. PATENT DOCUMENTS

2003/0138571 A1    7/2003  Kunishi et al.
2004/0131832 A1*   7/2004  Tsukaguchi et al. .......... 428/210

FOREIGN PATENT DOCUMENTS

| JP | 61-034180 | 2/1986 |
|---|---|---|
| JP | 63-026375 | 2/1988 |
| JP | 03-264677 | 11/1991 |
| JP | 09-246695 | 9/1997 |
| JP | 2002-180260 | 6/2002 |
| JP | 2003-253454 | 9/2003 |
| JP | 2004-165294 | 6/2004 |

OTHER PUBLICATIONS

International Preliminary Report on Patentability and Written Opinion of the International Searching Authority, Application No. PCT/JP2007/062588, mailed Feb. 12, 2009.
International Search Report for PCT/JP2007/062588 Dated Oct. 2, 2007.

* cited by examiner

*Primary Examiner* — Chau Nguyen
(74) *Attorney, Agent, or Firm* — Nixon Peabody LLP; Jeffrey L. Costellia

(57) ABSTRACT

An electroless Ni—P plating method according to the present invention includes the steps of: providing a substrate including an insulating substrate and a copper alloy layer that has a predetermined pattern including a plurality of island portions that are isolated from each other; providing a plating solution to carry out electroless Ni—P plating; providing a solid piece including Ni, Ni—P, Co or Co—Ni on at least the surface thereof; and bringing the solid piece into contact with the surface of at least two of the island portions that are both in contact with the plating solution, thereby selectively forming an electroless Ni—P plated coating on the surface of the island portions. Thus, the present invention provides a Ni—P plating method that can subject the copper pattern on the insulating substrate to high-precision selective Ni—P plating on an industrial basis.

11 Claims, 7 Drawing Sheets

(a)

10 μm (b)

5 μm (a)

10 μm (b)

5 μm

ELECTROLESS NI-P PLATING METHOD AND SUBSTRATE FOR ELECTRONIC COMPONENT

TECHNICAL FIELD

The present invention relates to an electroless Ni—P plating method and more particularly relates to an electroless Ni—P plating method and an electronic components board that can be used effectively in the manufacturing process of an electronic components board.

BACKGROUND ART

Recently, ceramic materials such as $Al_2O_3$, $Si_3N_4$ and AlN with excellent thermal resistance and electrical insulation properties have been used more and more often as materials for an electronic components board. As a method of making the surface of a ceramic substrate electrically conductive, an electroless plating process that needs no supply of electrical current is sometimes used. Also, according to the electroless plating process, a plated coating can be formed with high size precision, which is also beneficial.

For example, a bonded substrate, obtained by bonding a ceramic substrate and a copper alloy layer having a predetermined pattern together with a soldering material such as silver solder, has been used extensively as a substrate with good heat dissipation property. As used herein, the "copper alloy layer" means either a layer made of copper alone or a layer made of an alloy including copper. Also, such a substrate will sometimes be referred to herein as a "Cu pattern bonded substrate". In a Cu pattern bonded substrate, the Cu portion thereof is plated with Ni to increase the corrosion resistance and to get the soldering process done more easily. As electroless Ni plating processes, a Ni—P plating process and a Ni—B plating process are known. However, the Ni—P plating process has been adopted more extensively because the process ensures good corrosion resistance and high chemical resistance and yet can be done at a low cost.

In general, when copper is plated by the electroless Ni—P plating process, hypo-phosphoric acid is used as a reducing agent. However, since Cu is not active in reaction to hypo-phosphoric acid, the surface of copper needs to be activated with a catalyst such as palladium (Pd) or tin (Sn). Such a catalyst will be referred to herein as a "plating catalyst". And a process that uses a plating catalyst will be referred to herein as a "catalyst process". FIG. 8 shows the flow of the catalyst process.

First, a degreasing process step is performed to remove organic substances and other smudge from the surface of the Cu portion. If any smudge stayed on the surface of the Cu portion, then the surface of the Cu portion would not have uniform wettability to a plating solution, thus making the resultant plated coating uneven.

Thereafter, an oxide remaining on the surface of the Cu portion is etched away with an acid aqueous solution. In this process step, the surface of the Cu portion may be roughened if necessary.

Next, the surface of the Cu portion is activated by a method so-called "sensitizing activation". Specifically, first, the surface of the Cu portion is supplied with an Sn (tin) catalyst (activation process step I) and then supplied with a Pd (palladium) catalyst (activation process step II). Since these activation process steps I and II are carried out with the Cu portion immersed in an aqueous solution, divalent cations (i.e., $Sn^{2+}$ and $Pd^{2+}$) will be supplied to the surface of the Cu portion in both of these process steps. Once $Pd^{2+}$ has been supplied by the activation process step II, the reaction $Sn^{2+}+Pd^{2+} \rightarrow Sn^{4+}+Pd$ occurs, thus giving Pd to the surface of the Cu portion (activation process step III).

Subsequently, if the target to be plated, including the Cu portion, is immersed in an electroless Ni—P plating solution, Ni—P will precipitate where Pd has been deposited, thus forming a Ni—P plated coating. The plating reactions of this process step are represented by the following two chemical formulae:

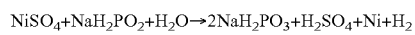

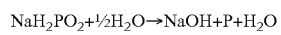

According to the catalyst process, an aqueous solution is used as described above to give Pd onto the surface of the Cu portion, and therefore, it is difficult to form a Ni—P plated coating selectively on the surface of the Cu portion, which is a problem. Hereinafter, the problems with the catalyst process will be described with reference to FIG. 9.

If the Cu portions 12a and 12b on the surface of a ceramic substrate 11 shown in FIG. 9(a) are plated by the catalyst process described above, then Pd will be given to not only the surface of the Cu portions 12a and 12b but also the surface of the ceramic substrate 11 as well as shown in FIG. 9(b). That is why if the substrate is immersed in the plating solution, not just a Ni—P plated coating 52a, 52b will be formed so as to cover the surface of the Cu portions 12a and 12b but also Ni—P plating residues 52c and 52d will be deposited from the Pd particles that have been left on the surface of the ceramic substrate.

Thus, if the catalyst process is adopted, a Ni—P plating layer 52a, 52b is formed as schematically shown in FIG. 9(d). Consequently, the minimum gap between two adjacent portions of the Ni—P plating layer that has been formed so as to cover the two adjacent Cu portions 12a and 12b should have been Wp1 but actually becomes Wp2 (where Wp2<Wp1). If the minimum gap between adjacent portions of the Ni—P plating layer becomes smaller than a predetermined value in this manner, then a decrease in dielectric strength and other serious problems will arise.

On top of that, the aqueous solution to supply the Pd catalyst includes a lot of organic substances as a complexing agent or as a stabilizer, which could remain on the plating interface and could cause swelling or peeling when heated.

To overcome these problems, an electroless Ni—P plating process that does not use any Pd catalyst has been proposed.

For example, Patent Document No. 1 discloses a process in which either hydrazine or a derivative thereof is used as a reducing agent to form a high-purity Ni coating only on the surface of the Cu portions and then the Ni coating is subjected to the electroless Ni—P plating process. However, the present inventors discovered and confirmed via experiments that even if such a method was adopted, it was still difficult to form the Ni—P plated coating selectively only on the surface of the Cu portions and also discovered that organic substances remained on the plating interface. On top of that, since the additional process step of forming a Ni coating should be carried out, the manufacturing process gets complicated.

Meanwhile, although it is related to Ni—B plating, a galvanic initiation is known as a method for subjecting a metallic material with no catalyst activity to electroless Ni plating as disclosed in Patent Document No. 2. According to the galvanic initiation method, when a Cu plate with no catalyst activity needs to be plated, for example, not just a Cu plate but also an Fe plate with catalyst activity are immersed in a plating bath and brought into physical contact with each other. Then, electrons are produced by the oxidation of a reducing agent on the surface of the Fe plate and then supplied to the surface of the Cu plate, thereby precipitating Ni and Ni—P there.

Patent Document No. 1: Japanese Patent Application Laid-Open Publication No. 2003-253454

Patent Document No. 2: Japanese Patent Application Laid-Open Publication No. 2002-180260

DISCLOSURE OF INVENTION

Problems to be Solved by the Invention

However, if a Ni—P plated coating were formed on the Cu plate by the galvanic initiation method using Fe, the Ni—P plated coating would not keep contact with the surface of the Cu plate closely enough to avoid swelling or peeling. In addition, since Fe is dissolved as an impurity in the plating solution, the life of the plating solution is shortened, thus making it expensive to do maintenance or management on the plating solution.

As described above, in a situation where a copper pattern that has been formed on a ceramic substrate to be used as an electronic material should be selectively plated with Ni—P with high precision, the conventional catalyst process or the galvanic initiation using a Fe plate would cause a lot of defects in terms of pattern accuracy and close contact, thus resulting in a low yield.

The problems with the prior art have been described as to an electronic components board in which a copper pattern has been formed on a ceramic substrate. However, those problems do not happen only on a ceramic substrate but could also happen even in a situation where the copper pattern has been formed on an insulating substrate other than the ceramic substrate.

In order to overcome the problems described above, the present invention has an object of providing, first and foremost, a Ni—P plating method that can subject a copper pattern on an insulating substrate to high-precision selective Ni—P plating on an industrial basis.

Means for Solving the Problems

An electroless Ni—P plating method according to the present invention is characterized by including the steps of: (a) providing a substrate including an insulating substrate and a copper alloy layer that has been formed on at least one of the surfaces of the insulating substrate, the copper alloy layer being made of either copper or an alloy including copper and having a predetermined pattern including a plurality of island portions that are isolated from each other; (b) providing a plating solution to carry out electroless Ni—P plating; (c) providing a solid piece including Ni, Ni—P, Co or Co—Ni on at least the surface thereof; and (d) bringing the solid piece into contact with the surface of at least two of the island portions that are both in contact with the plating solution, thereby selectively forming an electroless Ni—P plated coating on the surface of the at least two island portions.

In one preferred embodiment, the method further includes, before the step (b), the step of cleaning the surface of the copper alloy layer.

In another preferred embodiment, the step (d) includes bringing the solid piece into contact with the surface of the at least two island portions discontinuously.

In still another preferred embodiment, the solid piece has a surface oxide film with a thickness of 3 nm or less.

In yet another preferred embodiment, in the step (d), the plating solution has a temperature of 80° C. or higher.

In yet another preferred embodiment, in the step (d), the plating solution has a Ni concentration of 4 g/L or more.

In yet another preferred embodiment, the solid piece has a granular shape.

An electronic components board according to the present invention includes: a ceramic substrate; a copper alloy layer, which has been formed on at least one of the surfaces of the ceramic substrate, is made of either copper or an alloy including copper, and has a predetermined pattern including a plurality of island portions that are isolated from each other; and a plating layer, which is obtained by patterning an electroless Ni—P plated coating that covers at least two of the island portions. The board is characterized in that if the plating layer that has been formed on the upper surface of the at least two island portions has an average thickness tu, two adjacent ones of the at least two island portions have a minimum gap Wi, and the plating layer that covers the two adjacent island portions has a minimum gap Wp, $0.8 \leq \{(Wi-Wp)/2\}/tu \leq 1.3$ is satisfied.

In one preferred embodiment, the minimum gap Wi is 1 mm or less and the average thickness of the copper alloy layer is 0.3 mm or more.

In another preferred embodiment, the plating layer is in direct contact with the copper alloy layer.

In still another preferred embodiment, the plating layer includes no plating catalyst element (such as Pd).

In yet another preferred embodiment, element phosphorus included in the plating layer accounts for 5.0 mass % to 13.0 mass % of the entire plating layer.

Effects of the Invention

The present invention provides an electroless Ni—P plating method that can subject a copper pattern on an insulating substrate to high-precision selective Ni—P plating on an industrial basis. The present invention also provides an electronic components board including a copper pattern that has been subjected to the high-precision Ni—P plating.

Figure 1:
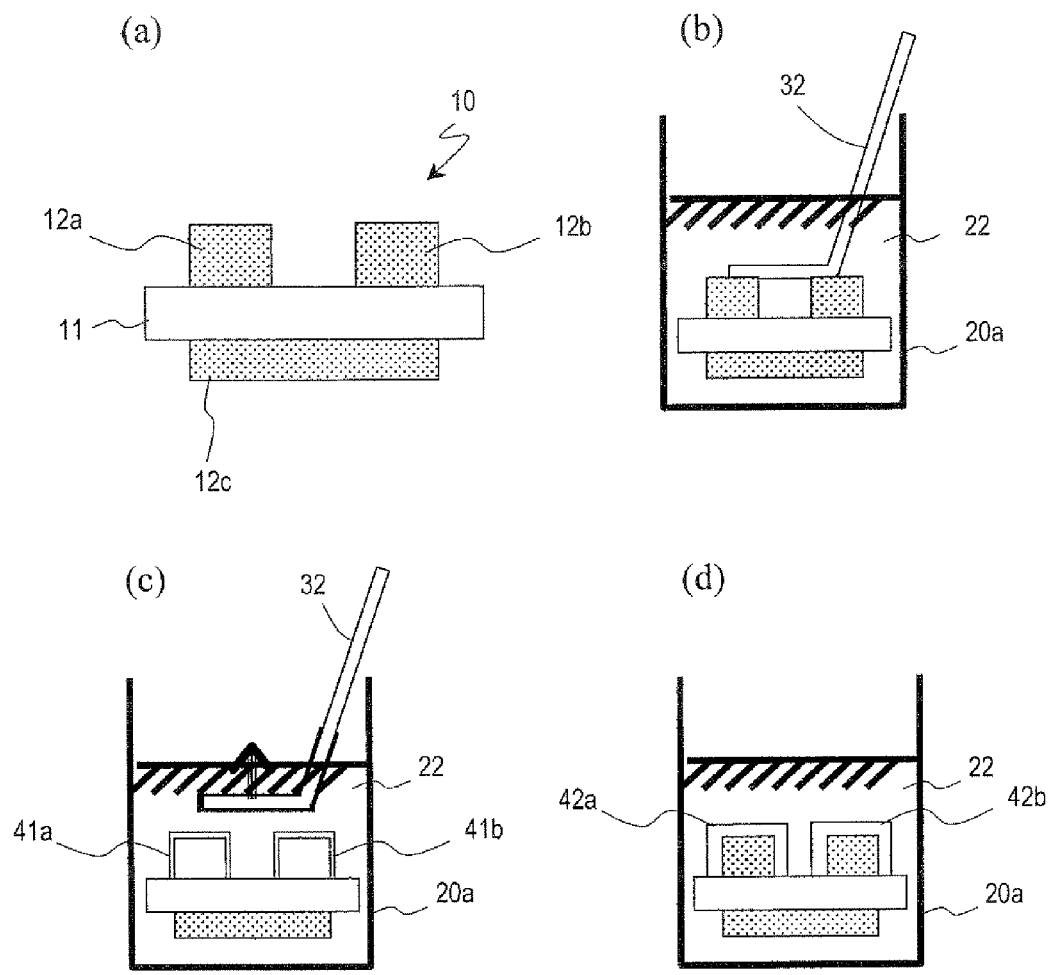
FIGS. 1(a) through 1(d) illustrate the respective process steps of an electroless Ni—P plating process according to the present invention.

DESCRIPTION OF REFERENCE NUMERALS 10 substrate with copper pattern
11 ceramic substrate
12a, 12b, 12c, 12d Cu island portion
20a container (plating vessel)
22 Ni—P plating solution
32 solid piece that triggers plating reaction
42a, 42b, 52, 52b Ni—P plating layer
62 Ni ball
70a nylon mesh case

BEST MODE FOR CARRYING OUT THE INVENTION

Hereinafter, preferred embodiments of an electroless Ni—P plating method according to the present invention will be described with reference to the accompanying drawings. In the following example, the present invention will be described as being applied to a method of making an electronic components board in which a copper pattern has been formed on a ceramic substrate. However, the present invention is in no way limited to that specific preferred embodiment but may be applied broadly to any situation where a copper pattern on any other insulating substrate (or at least an electrically insulating surface of a substrate) needs to be subjected to the electroless Ni—P plating.

A preferred embodiment of an electroless Ni—P plating method will be described with reference to FIGS. 1(a) through 1(d).

First of all, a substrate 10 with a copper pattern, including a ceramic substrate 11 and a copper alloy layer with a predetermined pattern that reaches the principal and back surfaces of the ceramic substrate 11, is provided. The portion of the copper alloy layer on the principal surface includes a number of Cu island portions 12a and 12b, while the other portion of the copper alloy layer on the back surface includes a Cu island portion 12c. A copper alloy layer for use in an electronic components board typically consists essentially of copper alone (i.e., oxygen-free copper with a purity of 99.9% or more). However, the present invention is in no way limited to that specific preferred embodiment. Alternatively, the copper alloy layer may also be made of an alloy including copper (more particularly, an alloy including at least 30 mass % of copper). For example, the copper alloy layer may be made of a nickel-copper alloy such as a Monel™. In the following description, a layer made of either copper alone or an alloy including copper will be referred to herein as a "copper alloy layer".

Before subjected to the electroless plating process step, the copper alloy layer (consisting of the Cu island portions 12a to 12c) preferably has its surface cleaned. The cleaning may be done by any known method such as degreasing with an organic solvent or cleaning or etching with an acid aqueous solution.

Next, as shown in FIG. 1(b), with the Cu island portions 12a to 12c immersed in a plating solution 22, a solid piece 32 including Ni, Ni—P, Co or Co—Ni on at least the surface thereof is brought into contact with the surface of the Cu island portions 12a and 12b. In this example, the solid piece 32 of Ni or Ni—P is brought into contact with the surface of the Cu island portions 12a to 12c with the ceramic substrate 11 with the Cu island portions 12a to 12c entirely immersed in the plating solution 22. However, the present invention is in no way limited to this specific preferred embodiment. Rather at least the Cu island portions 12a and 12b to be plated need to contact with the plating solution 22. It should be noted that these Cu island portions 12a to 12c are isolated from each other and should make contact with the solid piece 32 separately when plated.

In this case, as the solid piece 32 (which will sometimes be referred to herein as a "solid piece that triggers a plating reaction"), either a solid piece made of Ni, Ni—P, Co or Co—Ni (which may have the shape of a bar, a line, a plate or grains) or a solid piece made of any other material (e.g., a metal such as Fe or Cu or a plastic) and coated with a plating of Ni, Ni—P, Co or Co—Ni may be used. In the latter case, the plated coating is preferably formed so as to cover at least the portions to contact with the plating solution 22. Also, on the surface of the solid piece 32, Ni, Ni—P, Co or Co—Ni is preferably exposed. For that purpose, a surface oxide film is preferably removed in advance by a mechanical polishing or etching process and/or organic substance is preferably removed beforehand by degreasing. According to the results of research and development we carried out, where either Ni or Ni—P is used, if the thickness of the surface oxide film on the solid piece 32 exceeds 3 nm, then Ni or Ni—P sometimes cannot be precipitated on the surface of the Cu island portion 12a. On the other hand, according to the results of the experiments the present inventors carried out, if Co—Ni is used and if the Co—Ni alloy has a mass percentage ratio of 20 to 80, the thickness of the surface oxide film is preferably 3 nm or less. However, if either a Co—Ni alloy with a mass percentage ratio of 50 to 50 or more or Co is used, the thickness of the surface oxide film may exceed 3 nm. In this case, the Co—Ni alloy preferably includes more than 20 mass % of Co. Also, if Co is used, the thickness of the surface oxide film may exceed 3 nm.

The electroless Ni—P plating solution may be a known one. As the reducing agent, a one including hypo-phosphoric acid is preferably used.

The solid piece 32 may keep in contact with the Cu island portions 12a and 12b for a period of time of 2 through 15 seconds. This range is preferred because if the contact lasted for just less than two seconds, then the reaction could not be produced as intended. Nevertheless, if the contact lasted for more than 15 seconds, the stability would not change anymore. Also, if the solid piece 32 is kept in contact with the plating solution 22, then the Ni—P plated coating will also be formed on the surface of the solid piece 32 and the material will be wasted in vain. Furthermore, the solid piece 32 does not always have to keep in contact with the Cu island portions 12a and 12b all through that period, but may also contact with the surface of the Cu island portions 12a and 12b discontinuously.

For example, a brush with a lot of linear solid pieces 32 made of Ni, Ni—P, Co or Co—Ni may be brought into contact with the Cu island portions 12a and 12b while being rotated. Although the reason is not quite clear to us, the present inventors discovered via experiments that higher efficiency was achieved by the intermittent contact rather than the continuous contact. Also, the shape of the solid piece 32 may be appropriately determined according to the shape of the target to be plated. For example, if the target to be plated has an opening and if the inner surfaces of the opening should also be plated, a granular solid piece 32 is preferably used and preferably has such a size as to contact with the inner surfaces of the opening at least partially.

The solid piece 32 is introduced just to trigger the reaction. That is why once the plating reaction has been triggered, the solid piece 32 preferably breaks off contact with the Cu island portions 12a and 12b and is removed from the plating solution 22 as shown in FIG. 1(c).

Even after the solid piece 32 has broken off contact with the Cu island portions 12a and 12b and has been removed from the plating solution 22, an electroless Ni—P plated coating is still deposited continuously on the Cu island portions 12a and 12b, which keep in contact with the plating solution, thanks to the reducing action of the hypo-phosphoric acid as shown in FIG. 1(d). As will be described later by way of specific examples, considering the deposition rate of the plated coating and its variations, the temperature of the plating solution is preferably equal to or higher than 80° C. and more preferably adjusted to approximately 90° C. or more. Also, for the same reasons, the Ni concentration of the plating solution is preferably equal to or higher than 4 g/L and more preferably 5 g/L or more.

Figure 9:
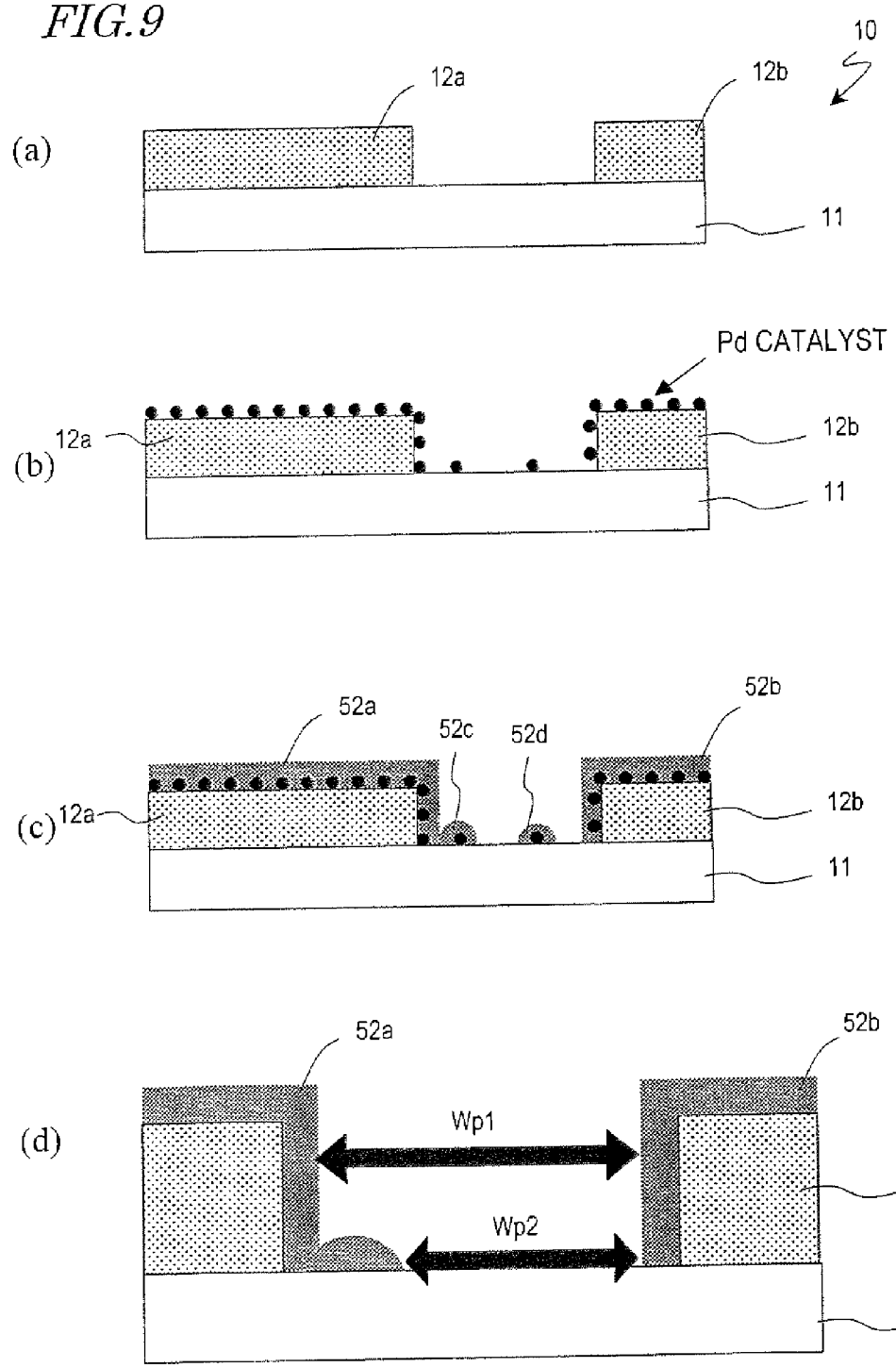
FIGS. 9(a) through 9(d) are schematic representations that point out a problem with the conventional electroless Ni—P plating process.

The plating process of the present invention does not require any plating catalyst such as Pd. Also, the electroless Ni—P plating layer is selectively formed only on the Cu island portions, with which the solid piece 32 has contacted to trigger the plating reaction. That is why unlike the prior art that has already been described with reference to FIG. 9, no plated coating will be left on the surface of the ceramic substrate and the minimum gap between adjacent portions of the Ni—P plating layer never becomes smaller than a predetermined value.

Particularly when Ni or Ni—P is used, there is no concern about contamination of the plating solution unlike the situation where Fe is used, for example, because Ni and P are both included in the plating solution. On top of that, as will be described later by way of specific examples, the degree of close contact at the interface between the Cu island portions and the plated coating is so high that there is no concern about swelling or peeling. Even if Fe is used, the plated coating can also be formed on Cu as described above. With Fe, however, parts of the coating will either not keep close contact (i.e., peel off) or have a roughened surface. This is probably because the reaction between Ni and Fe will advance too quickly (or too strongly) due to a significant potential difference between the electrode potential of Ni (−0.23 V) and that of Fe (−0.44 V). On the other hand, if Ni or Ni—P is used, then the reaction will advance at a moderate rate. As a result, sufficiently close contact will be achieved in the interface between the Cu island portions and the plated coating and no swelling or peeling will occur. In the prior art, it was widely believed that to trigger a reaction, Ni should be brought into contact with some base metal for Ni. Contrary to this misconception, the present inventors discovered and confirmed via experiments that even with the use of Ni or Ni—P, the electroless Ni—P plating reaction could also be triggered and a plated coating could also be formed with high degrees of close contact and film uniformity.

Likewise, even if Co or a Co—Ni alloy is used, the degree of close contact at the interface between the Cu island portions and the plated coating is so high that there is no concern about swelling or peeling, either, as will be described later by way of specific examples. The reason is that as the electrode potential of Co is −0.26 V, which is slightly lower than that of Ni, the electroless Ni—P plated coating will be formed at a moderate rate and will never peel. In addition, since Fe has a much lower electrode potential than Ni, Fe is very likely to be dissolved and stay in the plating solution and eventually deteriorate the plating solution. On the other hand, as Co has an electrode potential that is close to that of Ni, Co will quickly produce a eutectoid reaction to Ni even when dissolved in the plating solution, and will never be an impurity in the plating solution. Furthermore, Co also has metallic properties that are very similar to those of Ni, and will not affect the structure of the plated coating, either. In this manner, the present inventors discovered and confirmed via experiments that even by using either Co or a Co—Ni alloy, the electroless Ni—P plating reaction could be triggered and a plated coating could also be formed with sufficiently close contact and a high degree of film uniformity.

Next, the structural feature of an electronic components board as a preferred embodiment of the present invention will be described with reference to FIG. 2.

Figure 2:
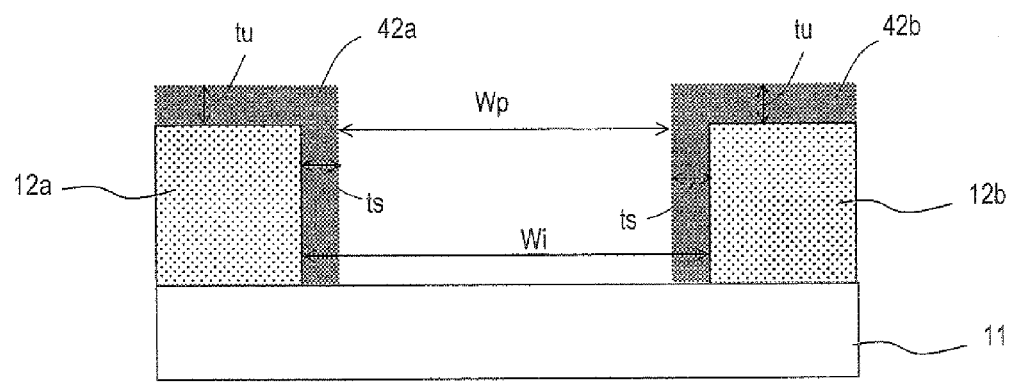
FIG. 2 is a cross-sectional view schematically illustrating the structure of an electronic components board according to the present invention.

The electronic components board shown in FIG. 2 includes a ceramic substrate 11, Cu island portions 12a and 12b that are arranged on the ceramic substrate 11 so as to be isolated from each other, and a plating layer 42a, 42b that has been obtained by patterning an electroless Ni—P plated coating so as to cover the Cu island portions 12a and 12b. In this case, supposing the portions 42a, 42b of the plating layer that cover the upper surface of the Cu island portions 12a and 12b have an average thickness tu, the Cu island portions 12a and 12b have a minimum gap Wi, and those portions 42a, 42b of the plating layer on the Cu island portions 12a and 12b have a minimum gap Wp, $0.8 \leq \{(Wi-Wp)/2\}/tu \leq 1.3$ is satisfied.

Stated otherwise, supposing other portions of the plating layer 42a, 42b that cover the side surfaces of the two adjacent Cu island portions 12a and 12b have a maximum thickness ts, $0.8 \leq ts/tu \leq 1.3$ is preferably satisfied. That is to say, if the plating layer 42a, 42b is formed by the method described above, then the plated coating portions 52c and 52d shown in FIG. 9(c) will not be formed but a plating layer with a substantially uniform thickness (≈ts) will be formed on the side surfaces of the two adjacent Cu island portions 12a and 12b. In this case, these values of 0.8 and 1.3 were obtained empirically as a result of various experiments the present inventors carried out. Parts of the results of those experiments will be described later.

As described above, in the electronic components board according to the present invention, the minimum gap between two adjacent Cu island portions can be controlled with high precision, thus never causing a decrease in dielectric strength or any other problem. Particularly when a thick Cu pattern needs to be formed with high precision such that the minimum gap Wi between the two adjacent Cu island portions 12a and 12b is 1 mm or less and that the Cu island portions 12a and 12b have an average thickness (or height) of 0.3 mm or more, an electronic components board with a sufficient dielectric strength of 2 kV, for example, cannot be obtained by any conventional technique. However, by adopting the plating process of the present invention, such an electronic components board can be obtained.

In addition, the plating layer formed by the plating process of the present invention is in direct contact with the Cu island portions 12a and 12b and includes no Pd or no organic substances such as a complexing agent. That is why the plating layer 42a, 42b can keep close contact with the surface of the Cu island portions 12a and 12b with high reliability. It should be noted that considering the electrical and mechanical properties of the plating layer and its wettability to solder, element phosphorus preferably accounts for 5.0 mass % to 13.0 mass % of the entire plating layer 42a, 42b.

EXAMPLES

Example 1

As a sample target to be plated, a sample substrate 10 having the same structure as the substrate 10 with a copper pattern shown in FIG. 1(a) was provided. The ceramic substrate 11 had a thickness of 0.3 mm, the top copper layer (including the Cu island portions 12a and 12b) had a thickness of 0.4 mm and the bottom copper layer (including the Cu island portion 12c) had a thickness of 0.3 mm. The outer dimensions of the sample substrate 10 were 50 mm (length)× 50 mm (width)×1.0 mm (thickness). An alumina substrate was used as the ceramic substrate 11. The alumina substrate and an oxygen-free copper plate with a purity of 99.9% were bonded together with solder and then patterned, thereby forming a copper layer including Cu island portions in a predetermined shape.

Figure 3:
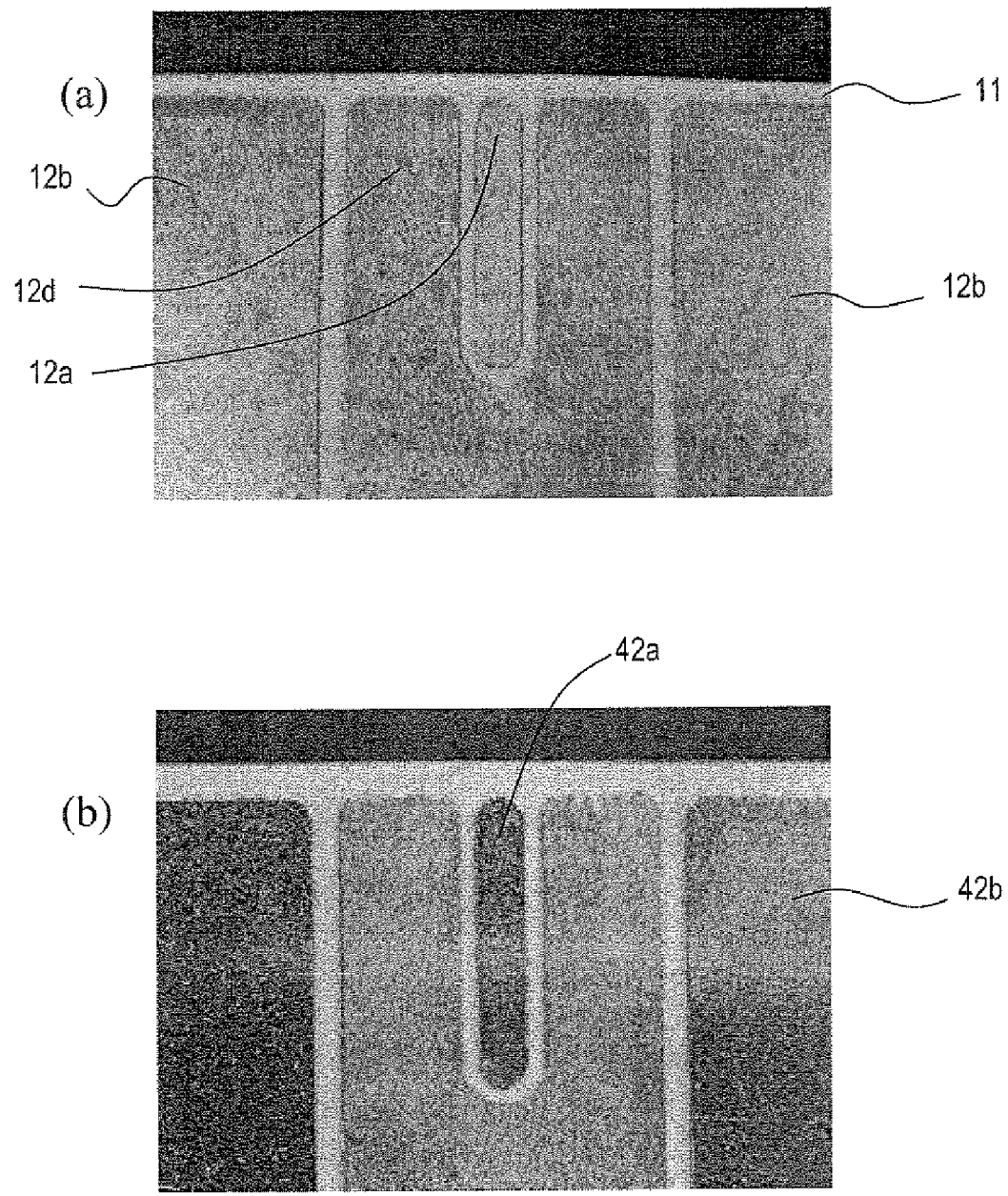
FIG. 3(a) is an optical micrograph of a top copper layer on a sample substrate used as a specific example of the present invention.
FIG. 3(b) is an optical micrograph of the copper layer plated with Ni—P.

FIG. 3(a) is an optical micrograph of the top copper layer. Cu island portions 12a through 12d were formed in the top copper layer so as to be isolated from each other. The Cu island portions 12b on the right- and left-hand sides were also isolated from each other. The gap between two adjacent Cu island portions was 1.5 mm. The bottom copper layer (i.e., the Cu island portion 12c shown in FIG. 1) covered almost the entire surface of the ceramic substrate 11. This sample substrate 10 with a copper pattern simulated an electronic components board to be provided for the electric equipment of a car.

Before being plated, the sample substrate 10 was degreased and acid-cleaned. The degreasing process was carried out by immersing the sample substrate 10 in a 0.5-5% alkaline aqueous solution (NaOH(KOH) plus surfactant) for three minutes. On the other hand, the acid cleaning process was carried out by immersing the sample substrate 10 in an aqueous solution of sulfuric acid and hydrogen peroxide for two minutes.

A plating solution 22 was provided in a plating vessel 20a with a volume of 40 L (see FIG. 1(b)). An aqueous solution including 0.1 M of $NiSO_4$ and 0.2 M of $NaH_2PO_2$ (and having a Ni concentration of 5.6 g/L) was used as the plating solution and its temperature was adjusted to 90° C.

Meanwhile, a Ni bar 32 with a purity of 98% or more (and φ of 6 mm×length of 100 mm) was provided. The Ni bar 32 had been etched with a ferric chloride solution for five minutes and then treated with (a 15% aqueous solution of) hydrochloric acid for three minutes in advance. The surface of this Ni bar 32 was evaluated by ESCA. As a result, the surface oxide film had a thickness that was less than 1 nm (which was the average at the four thickest portions thereof). On the other hand, without being subjected to the etching process using the ferric chloride solution and the hydrochloric acid treatment, the Ni bar 32 had a surface oxide film with a thickness of approximately 4 nm. If such a Ni bar 32 was used as it was, the amount of time it took to precipitate a Ni—P plating layer after the Ni bar 32 was brought into contact with the substrate varied significantly (and was sometimes as long as more than one minute). In the worst-case scenario, the plating layer did not precipitate at all.

As a result of various researches, the present inventors discovered that the surface oxide film should have a thickness of 3 nm or less. This is because if the thickness of the surface oxide film exceeded 3 nm, the contact between Cu and the Ni bar would be imperfect and the flow of electrons would be interrupted. As the surface oxide film on the Ni bar often has a thickness of greater than 3 nm (although it depends on how well the Ni bar has been maintained), the surface oxide film is preferably removed so as to have a thickness of less than 3 nm. The surface oxide film may be removed not just by an etching process but also by a mechanical polishing process, for example. Also, if necessary, smudge (such as organic substances) is preferably removed from the surface by a degreasing process.

After the sample substrate 10 was introduced into the plating solution 22, one end of the Ni bar 32 was brought into contact with the surface of the Cu island portions 12a and 12b and they were kept in contact with each other for five to ten seconds. As a result, Ni—P plating precipitated only on the surface of the Cu island portions 12a and 12b (as indicated by the reference numerals 41a and 41b in FIG. 1(c)). That is to say, the plating reaction was triggered by the contact with the Ni bar 32.

After that, the Ni bar 32 was removed and then an electroless plating process was carried out for 20 minutes, thereby obtaining a Ni—P plated coating 42a, 42b. FIG. 3(b) is an optical micrograph of the top copper layer plated. As shown in FIG. 3(b), the Ni—P plated coating 42a, 42b was formed only on the surface of the Cu island portions 12a and 12b that the Ni bar 32 was brought into contact with. No Ni—P plating precipitated on the surface of the ceramic substrate 11, either.

The plated coating thus obtained had a thickness (i.e., tu shown in FIG. 2) of 5.2 μm and a phosphorus content of 8.2 mass %. In this case, the thickness of the plated coating was measured with an X-ray fluorescence thickness meter and the phosphorus content was measured by EPMA.

Figure 4:
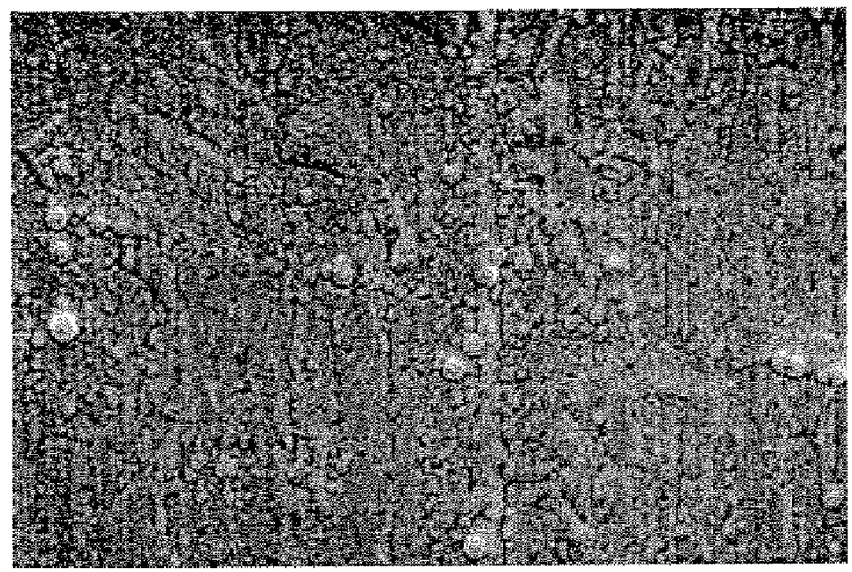
FIG. 4(a) is an optical micrograph representing the surface of a Ni—P plated coating on a sample substrate according to Example 1 of the present invention.
FIG. 4(b) is an optical micrograph representing a cross section of the sample substrate according to that Example 1.
Figure 4:
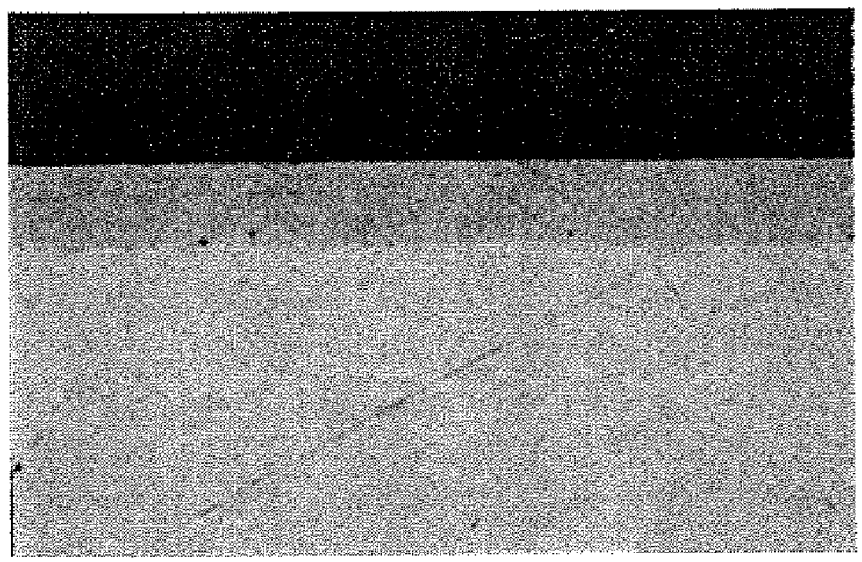

FIGS. 4(a) and 4(b) are optical micrographs representing the surface of the Ni—P plated coating thus obtained and a cross section of the Cu island portions plated, respectively. As can be seen from FIG. 4(a), a dense Ni—P plated coating was formed. It can also be seen from FIG. 4(b) that the Ni—P plated coating had a uniform thickness and kept close contact with the Cu island portions.

Using the same sample substrate, the entire surface of the top and bottom copper layers was covered with a plated coating. It was determined, using an optical microscope, whether or not plating residues were left between the Cu island portions of the top copper layer, and the thicknesses of the respective portions of the plated coating (i.e., tu and ts shown in FIG. 2) were measured. Also, the substrates thus obtained were kept in an electric furnace at 250° C. for 60 minutes, thus estimating the frequency of occurrence of swelling in the plated coatings (as the number of substrates that swelled in 100 sample substrates). The results are shown in Table 1.

Example 2

A Ni—P plating process was carried out in the same way as in Example 1 described above except that the Ni bar was replaced with a Ni—P plated Fe bar. The Ni—P plating layer could have a thickness of at least about 1 μm. While the Ni—P plated Fe bar was immersed in the plating solution, another Ni—P plated coating was formed thereon. Thus, the Ni—P coated Fe bar could be used repeatedly.

The Ni—P plated bar had been etched with a ferric chloride solution for one minute and then treated with (a 15% aqueous solution of) hydrochloric acid for one minute in advance. The surface oxide film had a thickness of 1 nm. When the surface of this Ni—P plated bar was evaluated by ESCA, the surface oxide film had a thickness of approximately 1 nm.

The plated coating thus obtained had a thickness of 5.1 μm and a phosphorus content of 8.2 mass %. The sample substrates thus obtained were rated as in Example 1. The results are also shown in Table 1.

Example 3

A Ni—P plating process was carried out in the same way as in Example 1 described above except that the Ni bar as a solid piece to trigger the plating reaction was replaced with a Co bar with a purity of 98% or more (and φ of 6 mm and a length of 100 mm). The Co bar had been etched with a ferric chloride solution for five minutes and then treated with (a 15% aqueous solution of) hydrochloric acid for three minutes in advance. The surface of this Co bar was evaluated by ESCA. As a result, the surface oxide film had a thickness that was less than 1 nm (which was the average at the four thickest portions thereof). The surface oxide film may be removed not just by an etching process but also by a mechanical polishing process, for example. Also, if necessary, smudge (such as organic substances) is preferably removed from the surface by a degreasing process.

After the sample substrate was introduced into the plating solution, one end of the Co bar was brought into contact with the surface of the Cu island portions 12a and 12b and they were kept in contact with each other for five to ten seconds. As a result, Ni—P plating precipitated only on the surface of the Cu island portions 12a and 12b. That is to say, the plating reaction was triggered by the contact with the Co bar.

After that, the Co bar was removed and then an electroless plating process was carried out for 20 minutes, thereby obtaining a Ni—P plated coating. When the top copper layer plated was observed with an optical microscope, a similar optical micrograph to the one shown in FIG. 3(b) was obtained. Also, as shown in FIG. 3(b), the Ni—P plated coating 42a, 42b was formed only on the surface of the Cu island portions 12a and 12b that the Co bar was brought into contact with. No Ni—P plating precipitated on the surface of the ceramic substrate 11, either.

The plated coating thus obtained had a thickness (i.e., tu shown in FIG. 2) of 5.2 μm and a phosphorus content of 8.2 mass %. In this case, the thickness of the plated coating was measured with an X-ray fluorescence thickness meter and the phosphorus content was measured by EPMA.

When the surface of the Ni—P plated coating thus obtained was observed with an optical microscope, similar results to the ones shown in FIGS. 4(a) and 4(b) were obtained. That is to say, a dense Ni—P plated coating was formed and the Ni—P plated coating had a uniform thickness and kept close contact with the Cu island portions. The sample substrates thus obtained were rated as in Example 1. The results are also shown in Table 1.

Example 4

A Ni—P plating process was carried out in the same way as in Example 3 described above except that the Co bar was replaced with a Co—Ni alloy bar. In this example, a Co—Ni alloy with a mass percentage ratio of 20 to 80 was used. The Co—Ni alloy bar had been etched with a ferric chloride solution for one minute and then treated with (a 15% aqueous solution of) hydrochloric acid for one minute in advance. The surface of this Co—Ni alloy bar was evaluated by ESCA. As a result, the surface oxide film had a thickness of approximately 1 nm.

The plated coating thus obtained had a thickness of 5.1 μm and a phosphorus content of 8.2 mass %. The sample substrates thus obtained were rated as in Example 1. The results are also shown in Table 1.

Example 5

In Examples 1 through 4 described above, a bar is used as a solid piece that triggers the plating reaction. On the other hand, in Example 5 and 6 to be described below, a granular solid piece is used.

The pre-treatment before the plating process was carried out as in Example 1 described above. When a Ni—P plating process was carried out, however, the Ni bar was replaced with granular pieces of solid of Ni (e.g., Ni balls with a diameter of 3.0 mm). Just before used, the Ni balls had their surface cleaned with (a 15% aqueous solution of) hydrochloric acid. Hereinafter, the plating process will be described with reference to FIGS. 7(a) through 7(d).

Figure 7:
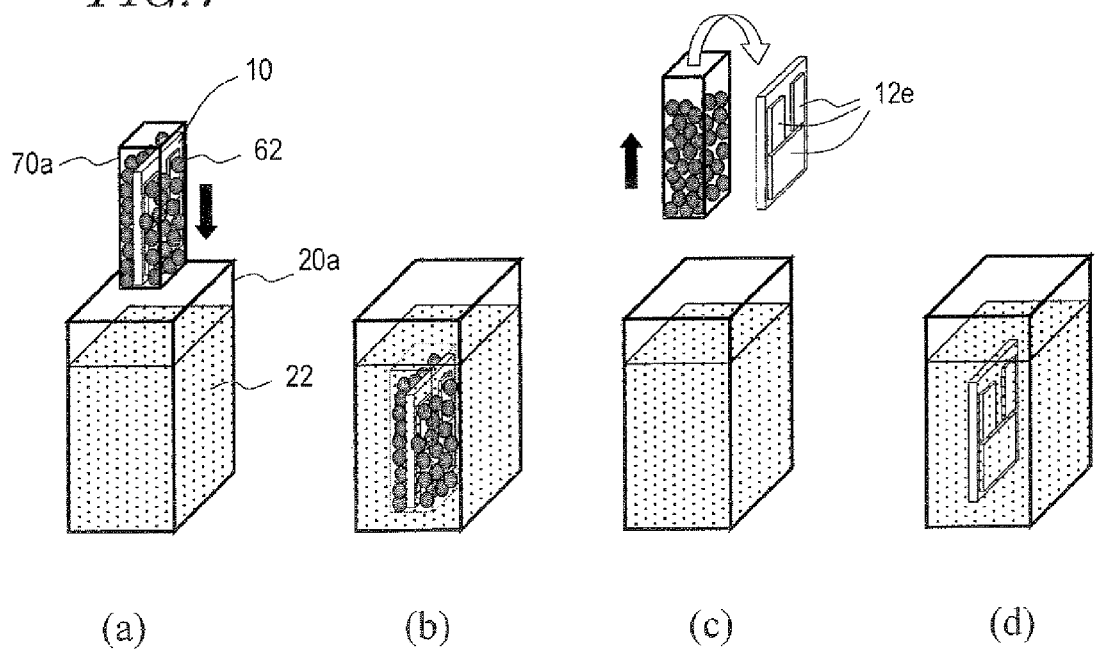
FIG. 7(a) through 7(d) illustrates respective process steps of a plating process according to Example 5 of the present invention.

First, as shown in FIG. 7(a), a nylon mesh case 70a was provided and loaded with a number of Ni balls 62 and a sample substrate 10.

Thereafter, as shown in FIG. 7(b), the mesh case 70a was immersed in its entirety in a plating solution 22 that had been poured into a plating vessel 20a with a volume of 40 L. The plating solution may be the same as the one used in Example 1.

When a plating layer precipitated (in five to ten seconds after the immersion) on Cu island portions 12e of the sample substrate 10 (which is the same as the counterpart of Example 1), the mesh case 70a was removed in its entirety from the plating solution 22 as shown in FIG. 7(c). Then, only the sample substrate 10 got immersed again in the plating solution 22 as shown in FIG. 7(d). It should be noted that the three types of Cu island portions will be collectively referred to herein as "Cu island portions 12e" for the sake of simplicity. Thereafter, an electroless plating process was carried out for approximately 30 minutes, thereby forming a Ni—P plated coating.

The plated coating thus obtained had a thickness of 5.0 μm and a phosphorus content of 8.5 mass %. The sample substrates thus obtained were rated as in Example 1. The results are also shown in Table 1.

Meanwhile, sample substrates, of which the Cu pattern had an opening, were also provided. Specifically, a 100 mm square ceramic substrate, on which 20 Cu patterns were arranged, was used as a sample substrate. Each of those Cu patterns had a substantially 2 mm square opening and a Cu portion pattern width of 1 mm. When 50 sample substrates with such a structure were plated by the same method as the one described above, a Ni—P plated coating was formed uniformly on every Cu pattern of the 50 substrates. When the substrates were observed with a 10× optical microscope, it was confirmed that the plated coating had also been formed uniformly inside the opening of each Cu pattern.

On the other hand, if those 50 sample substrates, of which each Cu pattern had an opening, were plated using a Ni bar as in Example 1 described above, then the plated coating failed to be formed at one or two spots on a substrate or two out of the 50 sample substrates. Such a portion where no plated coating was formed was on the inner surfaces of the opening of a Cu pattern.

As can be seen from these results, by using a lot of relatively small granular pieces of solid for Cu patterns, the pieces of solid (i.e., Ni balls in this example) can be brought into contact with the Cu pattern at a lot of points just as intended. Thus, it can be seen that this method can be used effectively to plate a fine Cu pattern.

Example 6

In this example, a polypropylene ball (which will be referred to herein as a "PP ball") with a diameter of 3 mm had its surface coated with Ni—P plating (with a thickness of 1 μm) and was used as a granular solid piece. The PP ball with the plated coating had a specific gravity of 0.99.

As in the specific example described above, a plating solution 22 was provided in a plating vessel 20a with a volume of 40 L. And a lot of PP balls with the plated coating were introduced into the plating solution 22. When the surface of the plating solution 22 was covered with a lot of those PP balls with the plated coating, a sample substrate (which may be the same as the counterpart of Example 1) was gradually immersed into the plating solution. When the sample substrate was fully immersed in the plating solution in five to ten seconds, Ni—P plating layer already precipitated on the Cu island portions. Thereafter, the PP balls with the plated coating were removed from the plating solution and then an electroless plating process was carried out for approximately 30 minutes, thereby forming a Ni—P plated coating.

The plated coating thus obtained had a thickness of 4.8 µm and a phosphorus content of 8.3 mass %. The sample substrates thus obtained were rated as in Example 1. The results are also shown in Table 1.

Comparative Example 1

Figure 8:
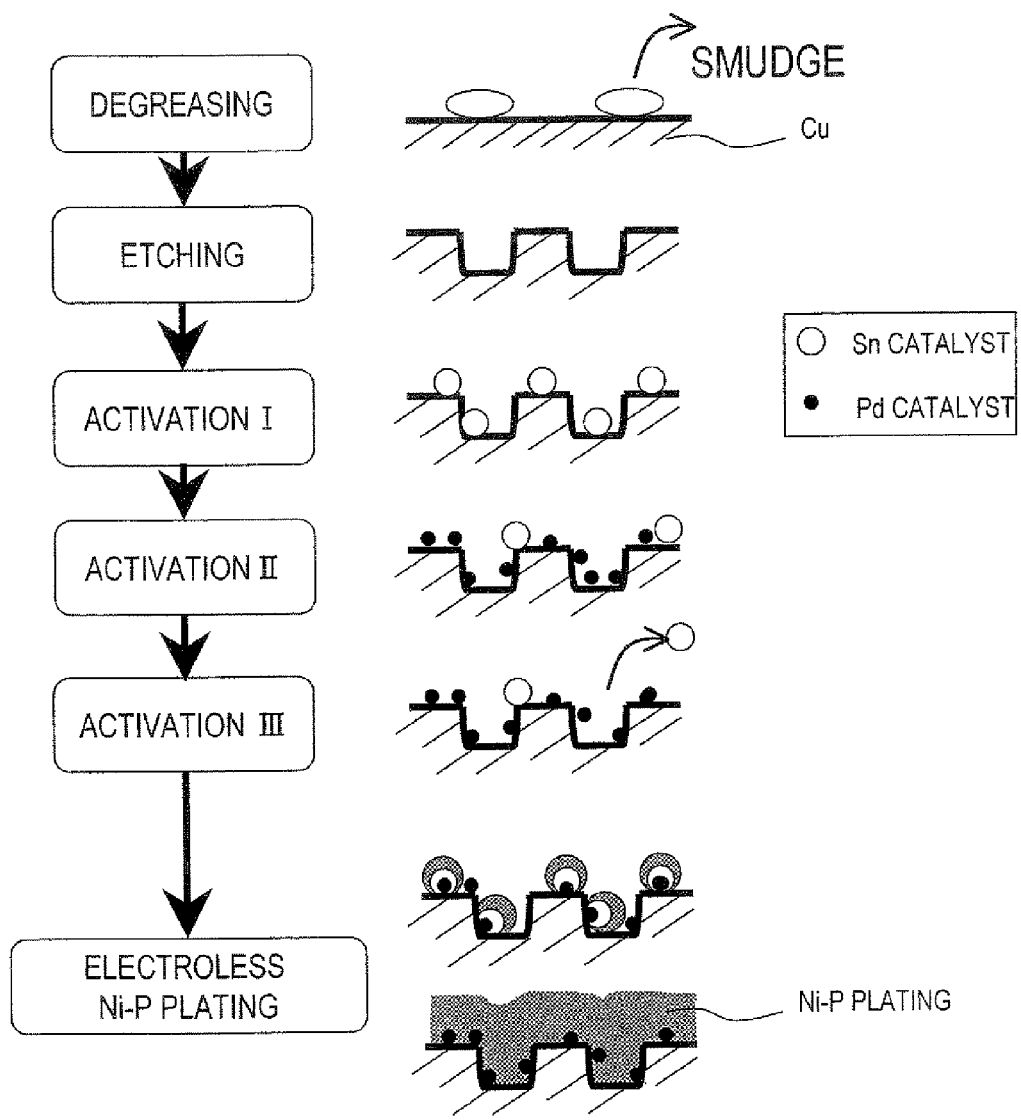
FIG. 8 illustrates respective process steps of a conventional electroless Ni—P plating process (catalyst process).

A Ni—P plated coating was formed on the same sample substrate as the one used in Example 1 by the conventional method that uses the Pd catalyst as already described with reference to FIG. 8. The Pd treatment was performed at 25° C. for one minute using a solution including palladium chloride and a complexing agent (e.g., Nyco ME-PD produced by Kizai Corporation). After that, the Ni—P plated coating was formed under the same conditions as those of Example 1.

The Ni—P plated coating thus obtained had a thickness of 5.2 µm and a phosphorus content of 8.1 mass %. The sample substrates thus obtained were rated as in Example 1. The results are also shown in Table 1.

Figure 5:
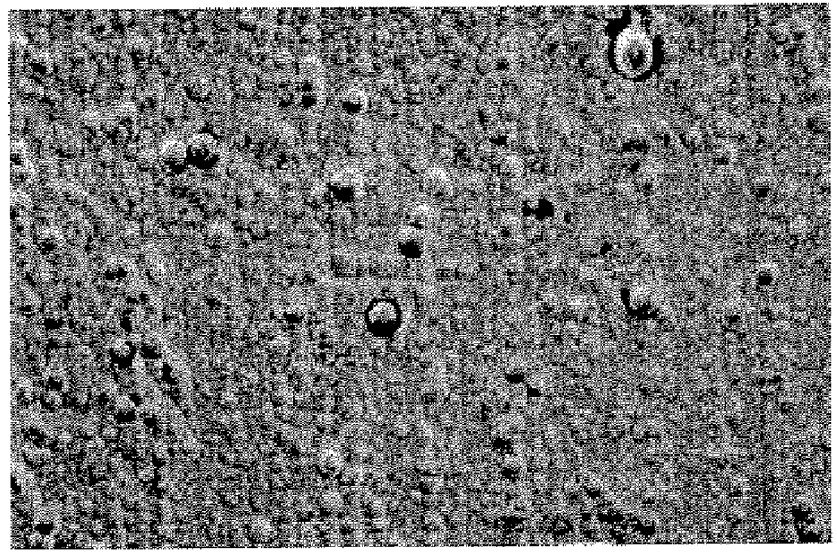
FIG. 5(a) is an optical micrograph representing the surface of a Ni—P plated coating on a sample substrate according to a comparative example.
FIG. 5(b) is an optical micrograph representing a cross section of the sample substrate according to that comparative example.
Figure 5:
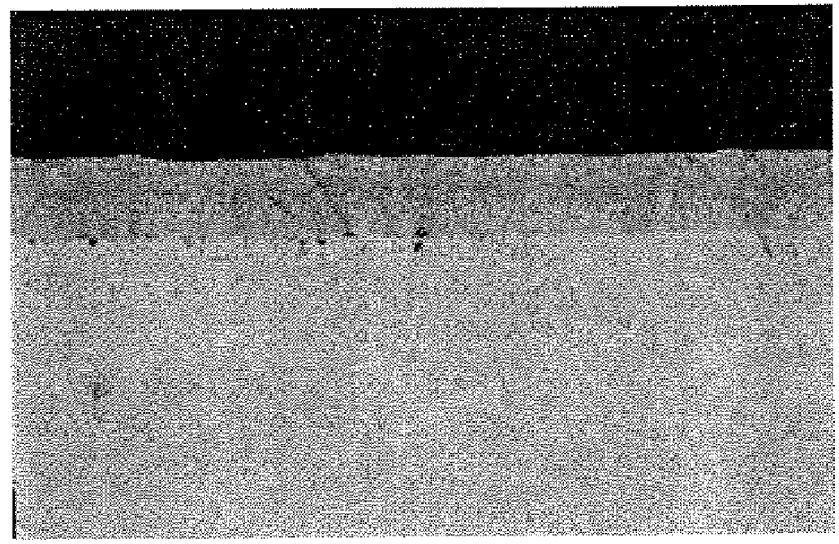

FIGS. 5(a) and 5(b) are optical micrographs representing the surface of the Ni—P plated coating thus obtained and a cross section thereof, respectively. As can be seen from FIG. 5(a), a dense Ni—P plated coating was formed. It can also be seen from FIG. 5(b) that the uniformity of the film thickness was inferior to Example 1.

Comparative Example 2

A Ni—P plating process was carried out in the same way as in Example 1 except that the Co bar was replaced with an Fe bar.

The plated coating obtained had a thickness of 5.2 µm and a phosphorus content of 8.1 mass %. Just after the plating process was finished, some parts of the plated coating had a significant surface roughness and other parts thereof peeled. The sample substrates thus obtained were rated as in Example 1. The results are also shown in Table 1.

TABLE 1

|  | Film thickness ratio ts/tu | Any plating residues left between Cu island portions? | Frequency of occurrence of swelling during heating test |
|---|---|---|---|
| Ex. 1 | 1.1 | NO | 0/100 |
| Ex. 2 | 1.2 | NO | 0/100 |
| Ex. 3 | 1.1 | NO | 0/100 |
| Ex. 4 | 1.2 | NO | 0/100 |
| Ex. 5 | 1.1 | NO | 0/100 |
| Ex. 6 | 1.1 | NO | 0/100 |
| Cmp. Ex. 1 | 1.9 | YES | 3/100 |
| Cmp. Ex. 2 | 1.2 | NO | 1/100 |

As can be seen from Table 1, the Ni—P plated coating that was formed on the sample substrates of Examples 1 through 6 had a ts/tu ratio of 1.2 or less (where ts is the thickness of the plating on the side surfaces of the Cu island portions and tu is the thickness of the plating on the upper surface of the Cu island portions) and was formed so as to have a uniform thickness on the upper and side surfaces of the Cu island portions. It can also seen that no plating layer precipitated between the Cu island portions, i.e., the plated coating could be formed selectively only on the Cu island portions. Furthermore, even when subjected to a heating test, the plated coating did not swell at all.

On the other hand, the plated coating that was formed on the sample substrate of Comparative Example 1 had the Ni—P plating residues 52c shown in FIG. 9(c), and therefore, had as large a film thickness ratio ts/tu as 1.9. In addition, Ni—P plating residues 52d were deposited between the Cu island portions. Furthermore, when subjected to a heating test, the plated coating swelled at three spots.

Meanwhile, as for the sample substrates of Comparative Example 2, the film thickness ratio ts/tu was 1.2, which is relatively small, and no plating residues were left between the Cu island portions. However, some portions of the Ni—P plated coating peeled off, and other portions swelled when subjected to a heating test, as described above.

As can be seen easily from these results, according to the Ni—P plating process of the present invention, only the Cu island portions can be selectively plated with Ni—P with higher precision and by a much simpler process than the conventional one. On top of that, each of the substrates of Examples 1 through 6 of the present invention achieves as high a dielectric strength as 5 kV or more between the Cu island portions, and therefore, can be used effectively as an electronic components board with high dielectric strength.

Figure 6:
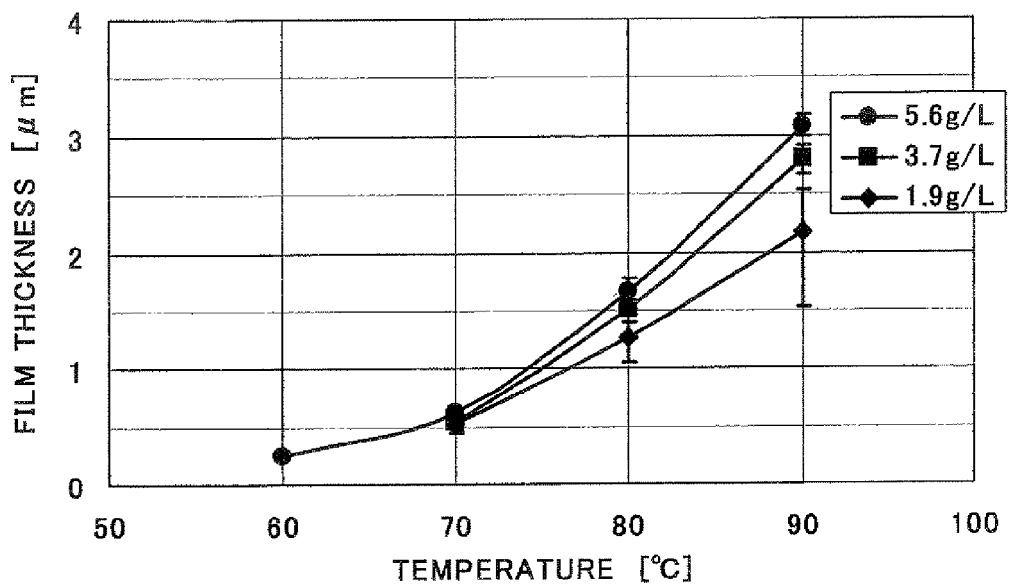
FIG. 6 is a graph showing how the thickness of the resultant plated coating changed with the temperature of the plating solution, which had any of three different Ni concentrations.

In Examples 1 through 6 of the present invention described above, an aqueous solution including 0.1 M of $NiSO_4$ and 0.2 M of $NaH_2PO_2$ (and having a Ni concentration of 5.6 g/L) is supposed to be used as the plating solution and its temperature is supposed to be adjusted to 90° C. However, the present invention is in no way limited to those specific examples. FIG. 6 shows how the thickness of the resultant plated coating changed with the temperature of the plating solution, which had any of three different Ni concentrations. In this case, the plating process was carried out for 20 minutes. As can be seen from FIG. 6, the lower the Ni concentration, the lower the rate of forming the plated coating and the greater the variation in film thickness. That is why the Ni concentration is preferably at least equal to 4 g/L. Also, to form the plated coating at a sufficiently high rate, the plating solution preferably has a temperature of at least 80° C., more preferably has a temperature in the range of 85° C. to 95° C. and most preferably has a temperature of around 90° C. However, as the temperature of the plating solution approaches 100° C., the plated coating could be formed at an excessively high rate and could have a decreased degree of uniformity. What is more, the plating solution would evaporate so much as to produce a decomposition reaction. For these reasons, the temperature of the plating solution is preferably adjusted to 95° C. or less.

Industrial Applicability

An electroless Ni—P plating method according to the present invention can be used effectively to make an electronic components board. Also, an electronic components board according to the present invention can be used particularly effectively in an application that requires a high dielectric strength.

The invention claimed is:

1. An electroless Ni—P plating method comprising the steps of:
    (a) providing a substrate including an insulating substrate and a copper alloy layer that has been formed on at least one of the surfaces of the insulating substrate, the copper alloy layer being made of either copper or an alloy including copper and having a predetermined pattern including a plurality of island portions that are isolated from each other;
    (b) providing a plating solution to carry out electroless Ni—P plating;
    (c) providing a solid piece including Ni, Ni—P, Co or Co—Ni on at least one surface thereof; and
    (d) bringing the solid piece into contact with the surface of at least two of the island portions that are both in contact with the plating solution, thereby selectively forming an electroless Ni—P plated coating on the surface of the at least two island portions.

2. The electroless Ni—P plating method of claim 1, further comprising, before the step (b), the step of cleaning the surface of the copper alloy layer.

3. The electroless Ni—P plating method of claim 1, wherein the step (d) includes bringing the solid piece into contact with the surface of the at least two island portions discontinuously.

4. The electroless Ni—P plating method of claim 1, wherein the solid piece has a surface oxide film with a thickness of 3 mm or less.

5. The electroless Ni—P plating method of claim 1, wherein in the step (d), the plating solution has a temperature of 80° C. or higher.

6. The electroless Ni—P plating method of claim 1, wherein in the step (d), the plating solution has a Ni concentration of 4 g/L or more.

7. The electroless Ni—P plating method of claim 1, wherein the solid piece has a granular shape.

8. The electroless Ni—P plating method of claim 1, further comprising, after step (d),
    (e) while the solid piece does not exist in the plating solution, depositing continuously the electroless Ni—P plated coating on the at least two of the island portions by keeping the surface of the at least two of the island portions in contact with the plating solution.

9. An electronic components board comprising:
    a ceramic substrate;
    a copper alloy layer, which has been formed on at least one of the surfaces of the ceramic substrate, is made of either copper or an alloy including copper, and has a predetermined pattern including a plurality of island portions that are isolated from each other; and
    a plating layer, which is obtained by patterning an electroless Ni—P plated coating that covers at least two of the island portions,
    wherein if the plating layer that has been formed on the upper surface of the at least two island portions has an average thickness tu, two adjacent ones of the at least two island portions have a minimum gap Wi, and the plating layer that covers the two adjacent island portions has a minimum gap Wp, $0.8 \leq \{(Wi-Wp)/2\}/tu \leq 1.3$ is satisfied,
    wherein the plating layer includes no plating catalyst element, and
    wherein element phosphorus included in the plating layer accounts for 5.0 mass % to 13.0 mass % of the entire plating layer.

10. The electronic components board of claim 9, wherein the minimum gap Wi is 1 mm or less and the average thickness of the copper alloy layer is 0.3 mm or more.

11. The electronic components board of claim 9, wherein the plating layer is in direct contact with the copper alloy layer.

* * * * *